(12) United States Patent
Zeng et al.

(10) Patent No.: US 7,227,247 B2
(45) Date of Patent: Jun. 5, 2007

(54) IC PACKAGE WITH SIGNAL LAND PADS

(75) Inventors: Xiang Yin Zeng, Shanghai (CN); Jiangqi He, Gilbert, AZ (US); BaoShu Xu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/060,104

(22) Filed: Feb. 16, 2005

(65) Prior Publication Data
US 2006/0180905 A1 Aug. 17, 2006

(51) Int. Cl.
*H01L 23/02* (2006.01)
(52) U.S. Cl. ............... 257/678; 257/780; 438/106; 438/107
(58) Field of Classification Search ............ 257/678, 257/700, 707, 684, 685, 686, 682, 780, 690, 257/723
See application file for complete search history.

(56) References Cited
U.S. PATENT DOCUMENTS

| 6,440,770 | B1 | 8/2002 | Banerjee et al. |
| 6,483,415 | B1 * | 11/2002 | Tang .................... 336/200 |
| 6,584,685 | B2 | 7/2003 | Chung et al. |
| 2002/0180004 | A1 * | 12/2002 | Oggioni et al. .......... 257/621 |
| 2004/0166660 | A1 * | 8/2004 | Yamaguchi ............. 438/613 |
| 2004/0169198 | A1 * | 9/2004 | Nagata et al. .......... 257/200 |

FOREIGN PATENT DOCUMENTS

JP 2004332687 * 11/2004

OTHER PUBLICATIONS translated of JP2004332687 attached.*

* cited by examiner

*Primary Examiner*—William David Coleman
*Assistant Examiner*—Su C Kim
(74) *Attorney, Agent, or Firm*—Schwabe, Williamson & Wyatt, P.C.

(57) ABSTRACT

In one embodiment, an integrated circuit package comprises a substrate including a first surface having a plurality of signal land pads and a second surface having a plurality of signal die pads; a plurality of signal connectors arranged to electrically couple the plurality of the signal land pads to the plurality of the signal die pads; and a ground plane, disposed in an adjacent, spaced-apart relationship to the plurality of signal land pads. The ground plane includes a plurality of holes with at least one of the holes having at least one of the signal connectors extending therethrough and being dimensioned and configured approximately to be as large or larger than at least one of the signal land pads disposed adjacent to the at least one hole.

23 Claims, 9 Drawing Sheets capacitance reduced

IC PACKAGE WITH SIGNAL LAND PADS

BACKGROUND

1. Technical Field

Embodiments of the present invention are related to the field of electronic devices, and in particular, to integrated circuit packages.

2. Description of Related Art

Referring to FIG. 1, a land grid array (LGA) package 10 includes an integrated circuit (IC) chip or die 12 mounted on a substrate 14. The LGA package 10 has an array of planar, typically rectangular or circular, conductive "land pads" 15 in a base layer located on its underside to provide external surface contacts for direct mounting to a printed circuit board (PCB) or indirect mounting to the PCB through a socket. The substrate 14 includes die pads 16 in a top layer which are coupled to the die 12 via solder bumps 18 using flip chip mounting or other by other die-to-substrate interconnects, such as wire bonding or tape automated bonding (TAB). The land pads 15 and die pads 16 are dedicated to the various power, ground and input/output (I/O) signals of the IC die 12. The substrate 14 typically contains a Vss ground plane consisting of one or more ground layers, such as ground layers 20A, 20B, and 20C, and one or more I/O signal routing layers, such as signal routing layers 22A and 22B (partially shown), and one or more power layers, such as power layer 24. Vias 26 interconnect the various metal layers and pads to form electrical connections between the land and die pads 15 and 16.

In current designs for LGA packages, as illustrated by the LGA package 10, a large capacitance may exist between signal land pads 15 and a Vss ground layer 20A adjacent to the signal land pads 15. This large capacitance may degrade the high frequency signal performance. The planar dimension of the land pads 15 is large (1 mm diameter) and the thickness dimension of a dielectric layer 28 is thin (30 um); hence, the capacitance between the land pads 15 and the ground layer 20A may be large enough to impact signals in GHz frequency range.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 2:
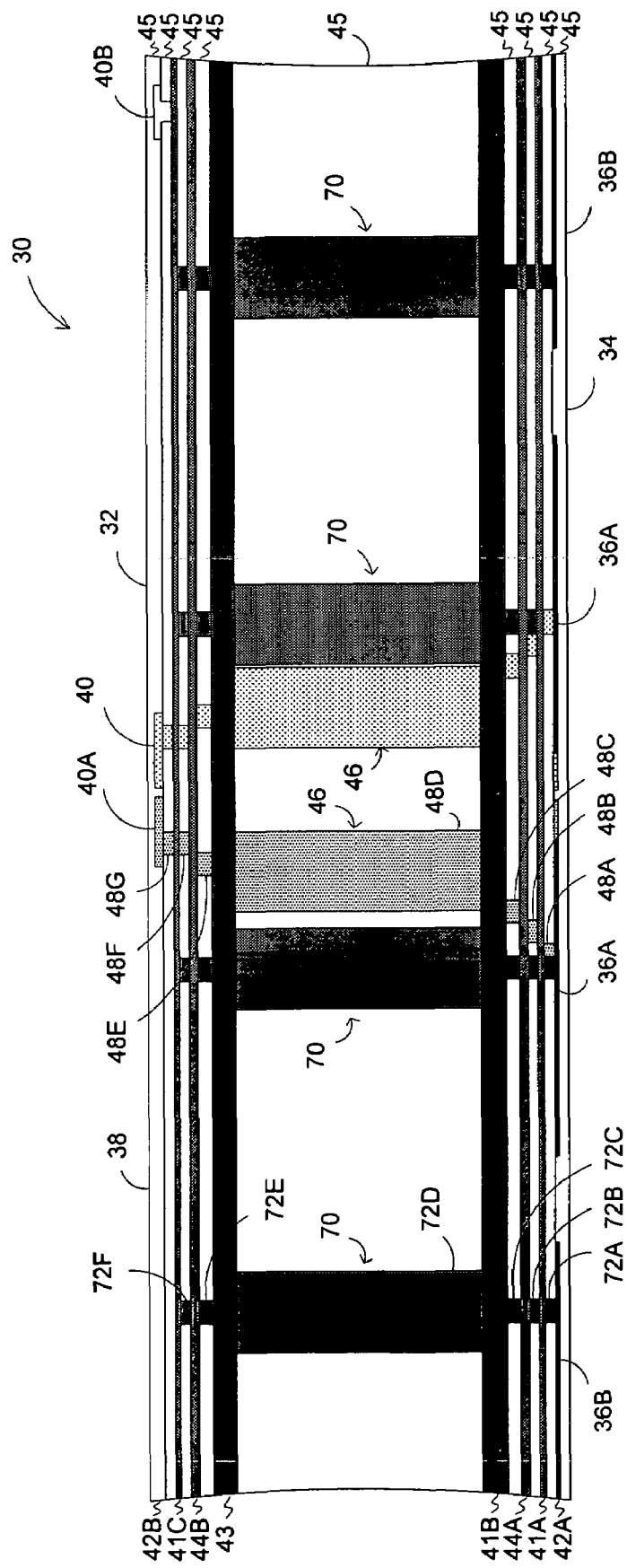
FIG. 2 is a side cross-sectional view of LGA package according to one embodiment of the present invention.
Figure 3:
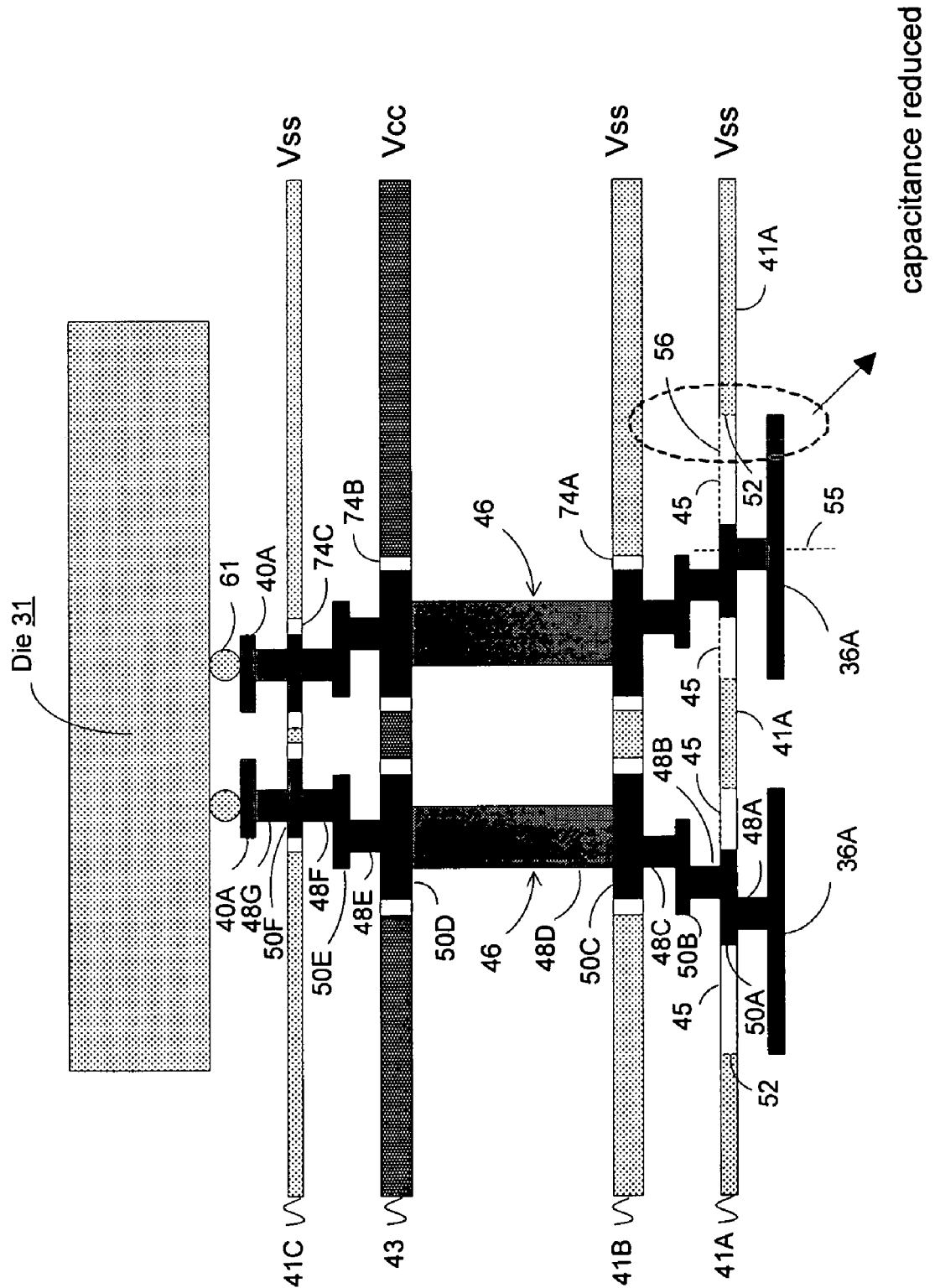
FIG. 3 is a side cross-sectional view of the LGA package of FIG. 2 with most of the dielectric layers removed.

LGA packages in the various embodiments described hereinafter are directed toward at least reducing capacitance between I/O signal land pads and a Vss plane disposed adjacent to the I/O signal land pads. Large capacitance may degrade high frequency performance. Hence, by reducing the large capacitance, enhanced high speed electrical performance of the LGA packages may be achieved. In one embodiment according to the present invention, holes are formed in the ground plane adjacent to the signal land pads to reduce the capacitance. In another embodiment according to the present invention, in addition to the holes being formed in the ground plane, inductors are interposed into the I/O signal paths to further reduce the capacitance. FIG. 2 illustrates a segment of a LGA package 30 showing all of its layers. FIG. 3 illustrates the LGA package 30 with much of the dielectric material of the layers shown in FIG. 2 removed so as to better illustrate metal layers and signal traces and to simplify the presentation.

With reference to FIGS. 2 and 3, there is illustrated the LGA package 30 according to one embodiment of the present invention. The LGA package 30 carries an IC chip or die 31, such as a processor chip. The package 30 may include a multi-layer substrate 32, only a small segment of which is shown in FIGS. 2 and 3. The substrate 32 may have an external first surface 34 with a plurality of spaced-apart land pads 36 arranged to connect with a printed circuit board (PCB) or a socket and an opposed second surface 38 having a plurality of die pads 40 arranged to connect with the IC chip. The land pads 36 and die pads 40 may include pads for power, ground and I/O signals. Those land pads 36 dedicated to I/O signals are referred to as "signal land pads" 36A, those dedicated to ground voltage Vss are referred to as "ground land pads" 36B, and those dedicated to one or more power voltages Vcc are referred to as "power land pads". The power land pads are not shown in the illustrative segment of the substrate 32, but are disposed on other portions of the substrate 32. The die pads may be correspondingly named, e.g., signal die pads 40A, ground die pads 40B, and power die pads (none illustrated).

The package 30 may have multiple conductive layers (e.g., power, ground, and I/O signal routing layers), with the package 30 including at least two reference planes (each formed from one or more layers) which may be set at the power rails and have opposite polarities: a Vcc power plane and a Vss ground plane. In one embodiment, as shown in FIG. 2, there may be one or more ground layers forming the Vss ground plane, such as ground layers 41A, 41B, 41C. The base layer 42A may include the land pads 36 and the top layer 42B may include the die pads 40. The package 30 may have one or more power layers, such as power layer 43, to form at least one Vcc plane. In another embodiment, there may be multiple power layers to provide multiple power voltages to some IC chips, such as processor chips. The package 30 may include one or more I/O signal routing layers, such as signal routing layers 44A and 44B. In one embodiment, the power and ground layers may have metal deposited on a dielectric material 45 and the signal layers may have metal traces deposited on the dielectric material 45.

Figure 4:
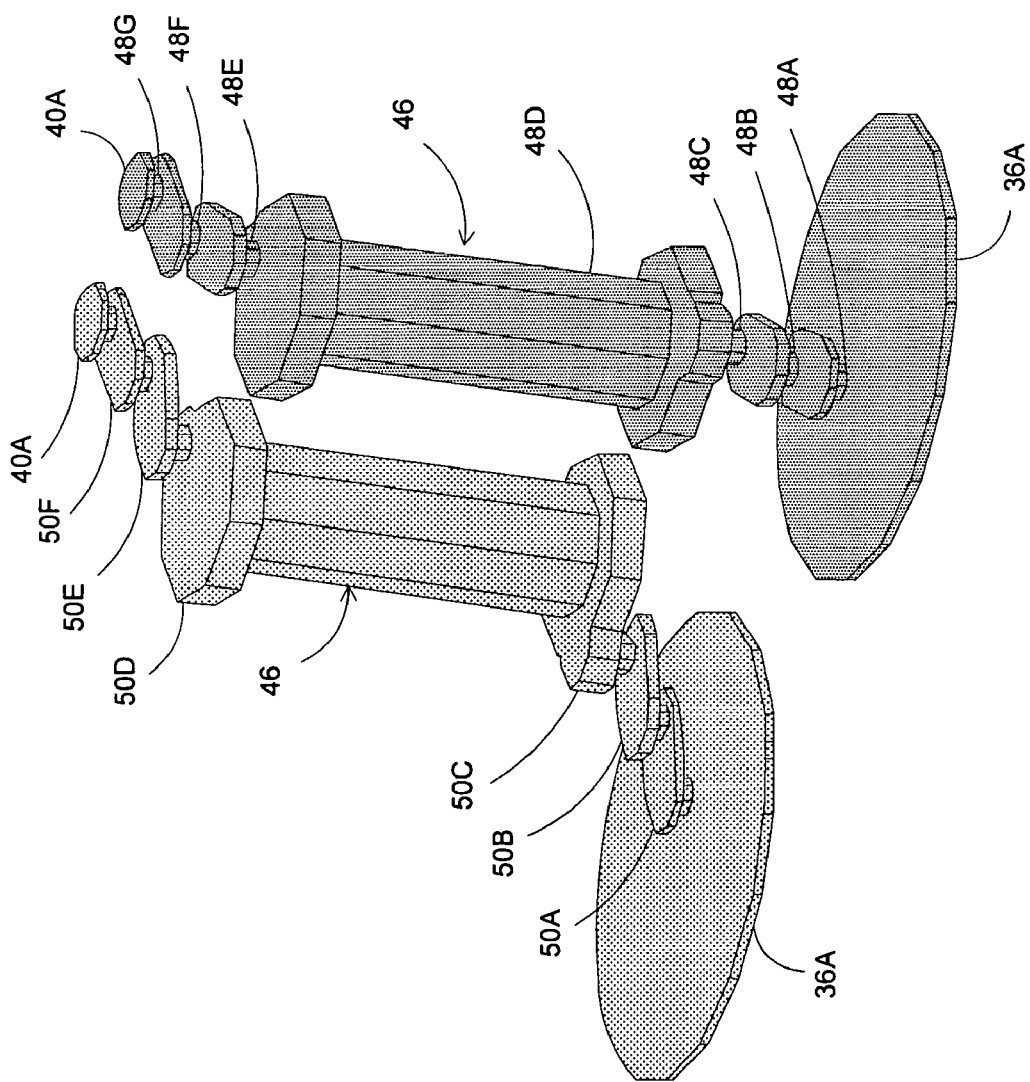
FIG. 4 is an enlarged perspective view of a pair of differential signal connectors used in the LGA package of FIGS. 2 and 3.

As illustrated in FIGS. 2–4, the LGA package 30 may use differential signaling techniques, where both the signal and its complement are transmitted, and a receiver detects a relative change in voltage between the two wires carrying the signals. The LGA package 30 may be adapted for differential signaling by using a pair of adjacent signal land pads 36A and a pair of adjacent signal die pads 40A for each pair of differential signals. With differential signaling, a plurality of pairs of signal connectors 46 for the I/O differential signals extend from each pair of the signal land pads 36A to each pair of the signal die pads 40A, with each signal connector 46 being electrically isolated from other signal connectors 46 and from the ground layers 41A–C and power layer 43. The pairs of signal connectors 46 for differential signals may be referred to as "differential signal connectors".

Each of the signal connectors 46 may include a plurality of signal vias 48 and a plurality of metal traces 50 on various layers connecting the signal vias 48. More specifically, in one embodiment each of the signal connectors 46 may include signal vias 48A, 48B, 48C, 48D, 48E, 48F, and 48G, which are generally referred to as signal vias 48. Likewise, each of the signal connectors 46 may include includes signal traces 50A, 50B, 50C, 50D, 50E, and 50F, which are generally referred to as signal traces 50. In another embodiment, differential signaling may not be used; hence, there may not pairs of adjacent signal land pads 36A surrounded by ground land pads 36B, but instead may have a single signal land pad 36A surrounded by ground land pads 36B.

Figure 1:
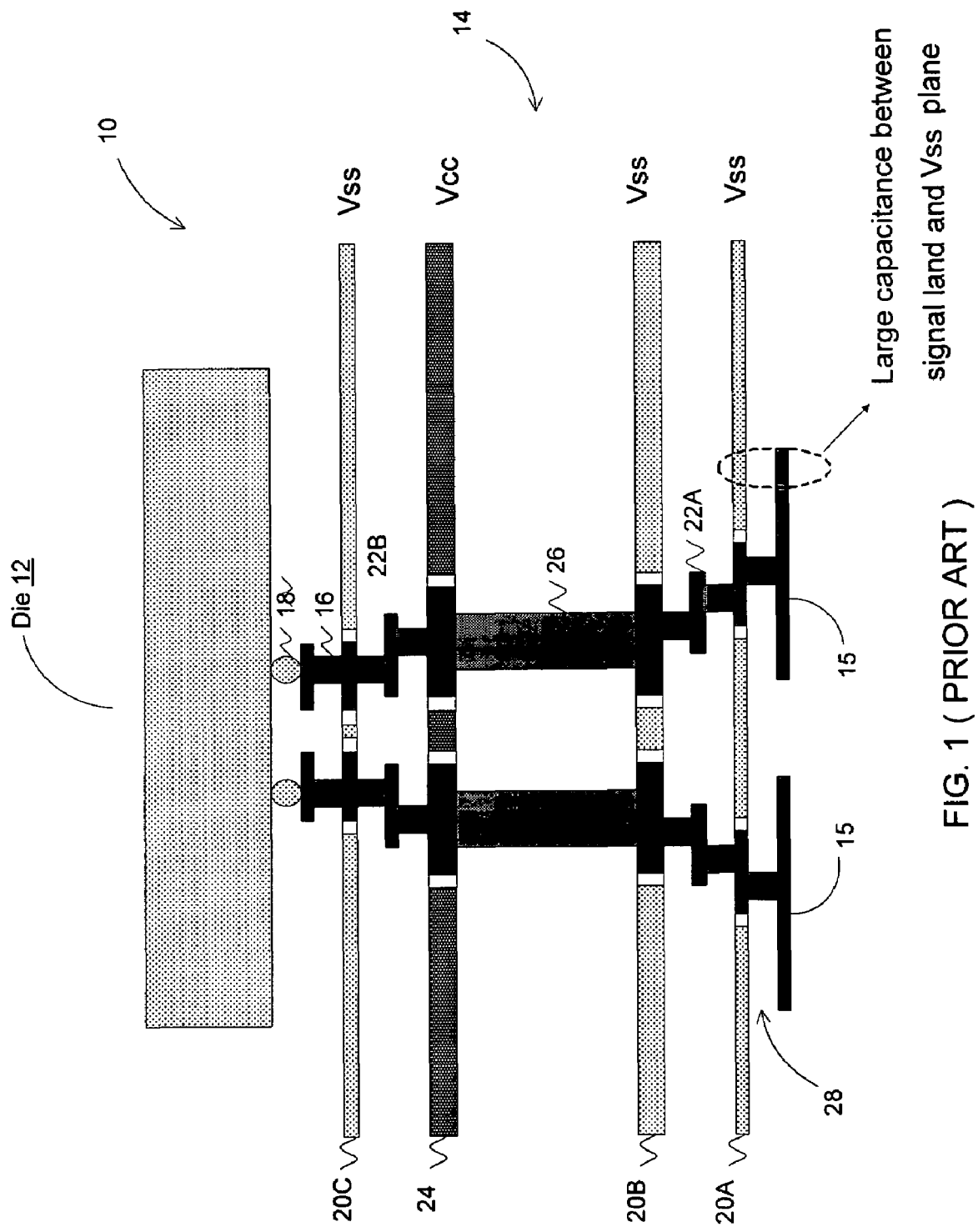
FIG. 1 is a side cross-sectional view of a conventional LGA package.
Figure 5:
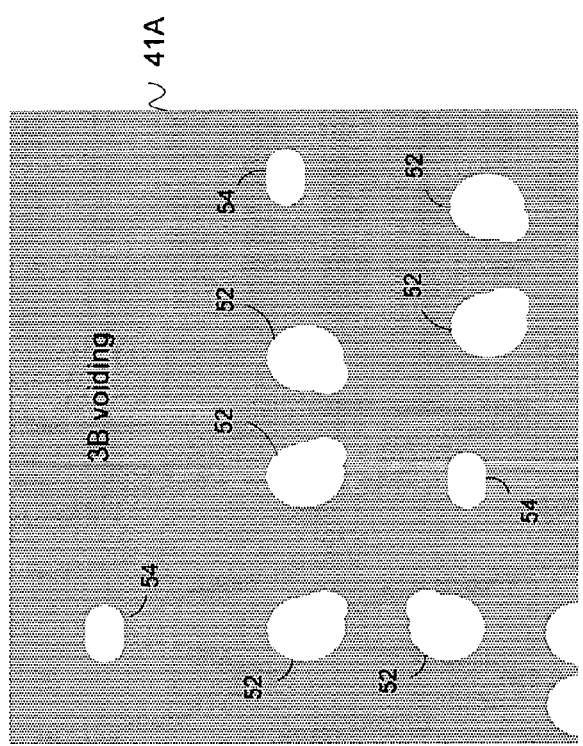
FIG. 5 is a planar view of a segment of a ground plane contained within the LGA package of FIGS. 2 and 3.

With reference to FIGS. 3 and 5, for each signal connector 46, a void or hole 52 may be formed in the Vss ground plane 41A in one embodiment. A plurality of pair of holes 52 are illustrated in FIG. 5, with each of the pairs of holes 52 being aligned to receive one of the pairs of connectors 46 for differential signals. In FIG. 5, each of walls of the holes 52 surrounds one of the signal connectors 46 of FIGS. 3 and 4. If not enlarged, the holes 52 would be the size of non-enlarged holes 54 shown in FIG. 5. The holes may be dimensioned and configured to substantially match the size of their associated signal land pad 36A. Additionally, the centers of holes 52 may be approximately aligned with center axes 55 of the associated signal land pads 36A. Consequently, the width dimensions or diameter (if circular) of the holes 52 are substantially larger than the cross-sectional dimensions of the signal connector 46 at the point where it traverses the hole 52, leaving a circular gap or space 56 to be filed with a dielectric material. In the illustrative embodiment, the land pads 36A are generally circular pads. If the land pads 36A are more rectangular in shape, the holes 52 may be made more rectangular in shape. The holes 52 may be formed by removing the metal from the ground layer 41A and replacing it with dielectric material 45 (filled area shown with dashed lines in FIG. 3). In contrast, in the prior art (as shown in FIG. 1), there is a solid metal ground layer around the signal connectors 46 just above the signal land pads 36A. To the contrary, creating the holes 52 in the Vss ground layer 41A around the signal connectors 46 above the signal land pads 36A may decrease the capacitance between the land pads 36A and the Vss ground layer 41A in the LGA package 30.

Figure 6:
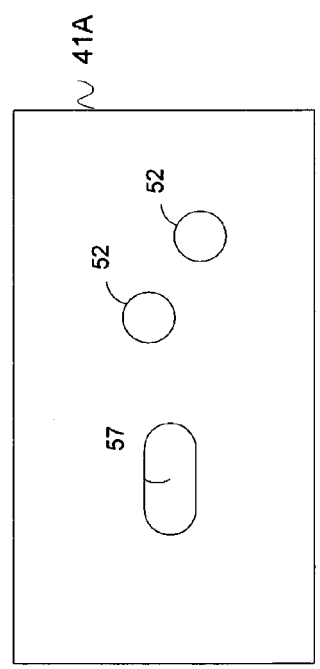
FIG. 6 is a planar view of a segment of the ground plane contained within the LGA package of FIGS. 2 and 3 which uses an enlarged hole.

With reference to FIG. 6, in another embodiment, the metal between the pair of adjacent holes 52 may be removed so as to form a single enlarged hole 57. In FIG. 6, the enlarged hole 57 is shown where two holes have been combined and two holes 52 are shown which have not been combined. Generally, in this embodiment, all the pairs of differential signal connectors 46 may each be disposed in one of the enlarged holes 57. Each hole 57 has dimensions that exceed the cross-sectional dimensions of the pair of signal connectors at the point where they pass through the enlarged hole 57. In one embodiment, the enlarged hole 57 may be as large or larger than the pair of land pads 36A attached to the differential signal connectors 46 passing through the hole 57. The enlarge hole 57 may be substantially centered over the center axis of the combined signal land pads 36A.

In another embodiment (not shown) wherein two adjacent ground layers of the Vss plane are located next to the land pads 36A (for example, if the signal routing layer 44A of FIG. 2 was another ground layer instead), then concentric holes may be formed in both ground layers and aligned with the center axis of one of the signal land pads or in the case of an enlarged hole and differential signaling, with the center of the combined pair of adjacent signal land pads for a differential signal. Generally, it is not desirable to create a hole in the ground plane 41B so as not to influence the power delivery.

Figure 7:
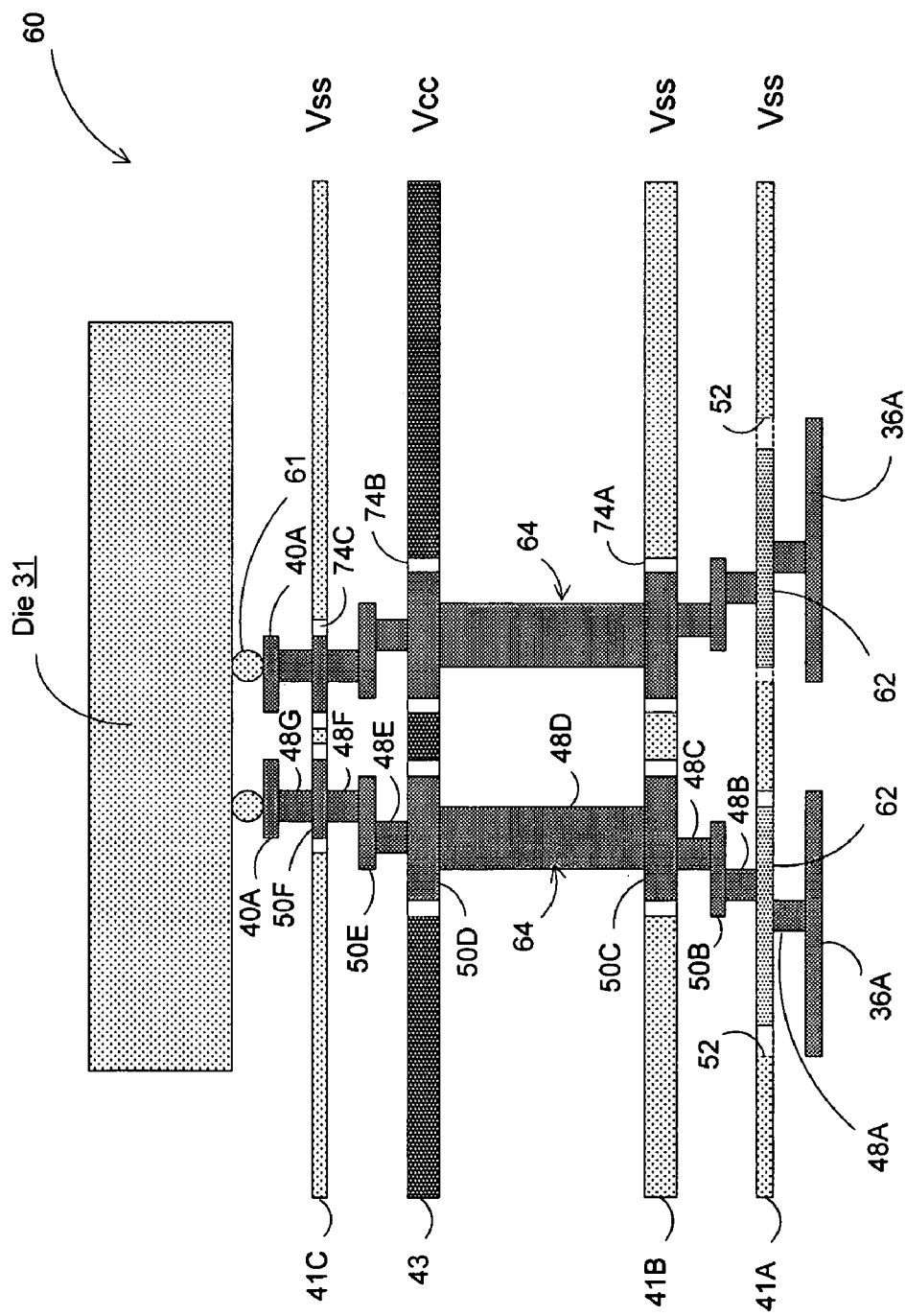
FIG. 7 is a side cross-sectional view of an LGA package according to another embodiment of the present invention.
Figure 8:
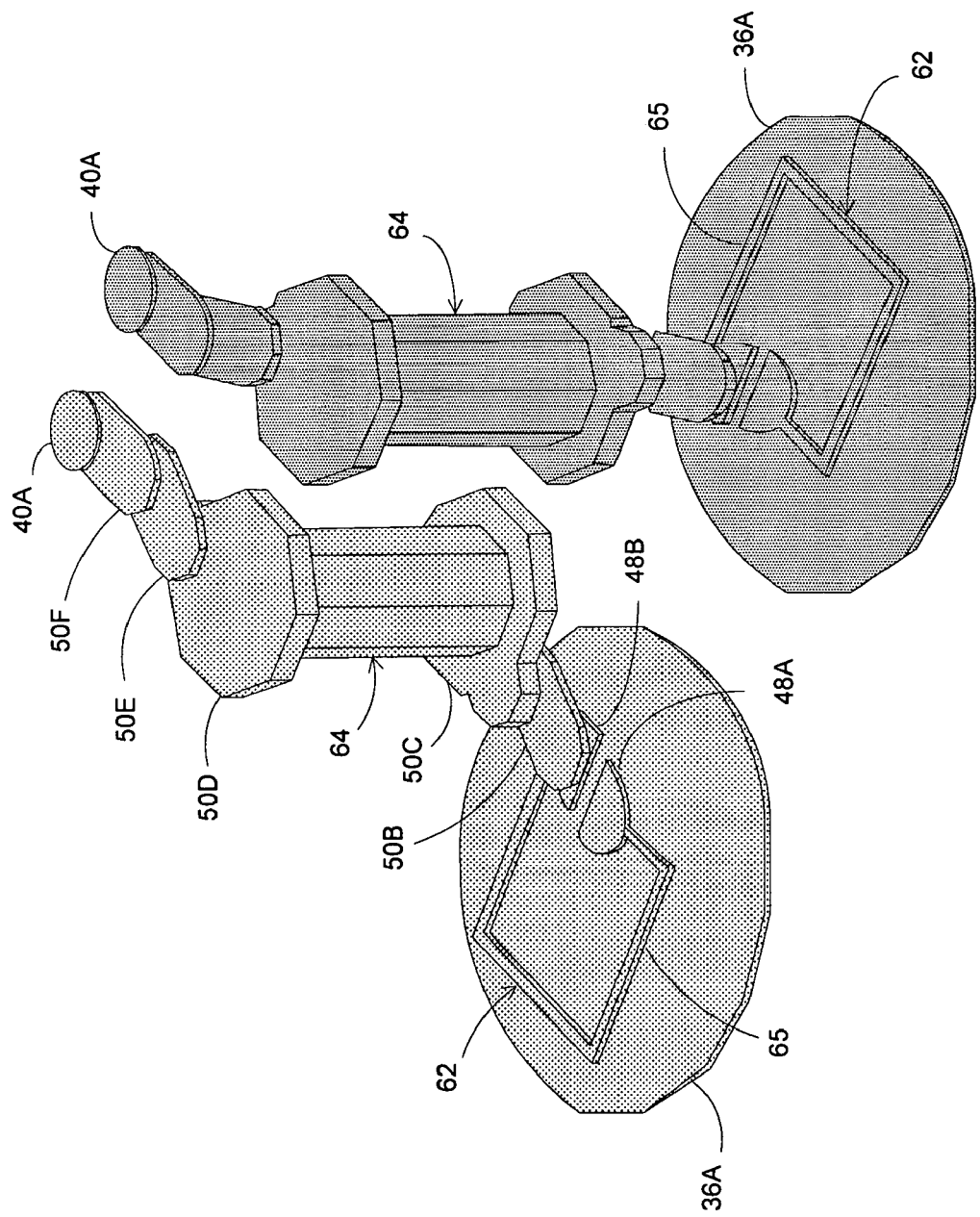
FIG. 8 is an enlarged perspective view of a pair of differential signal connectors used in the LGA package of FIG. 7.
Figure 9:
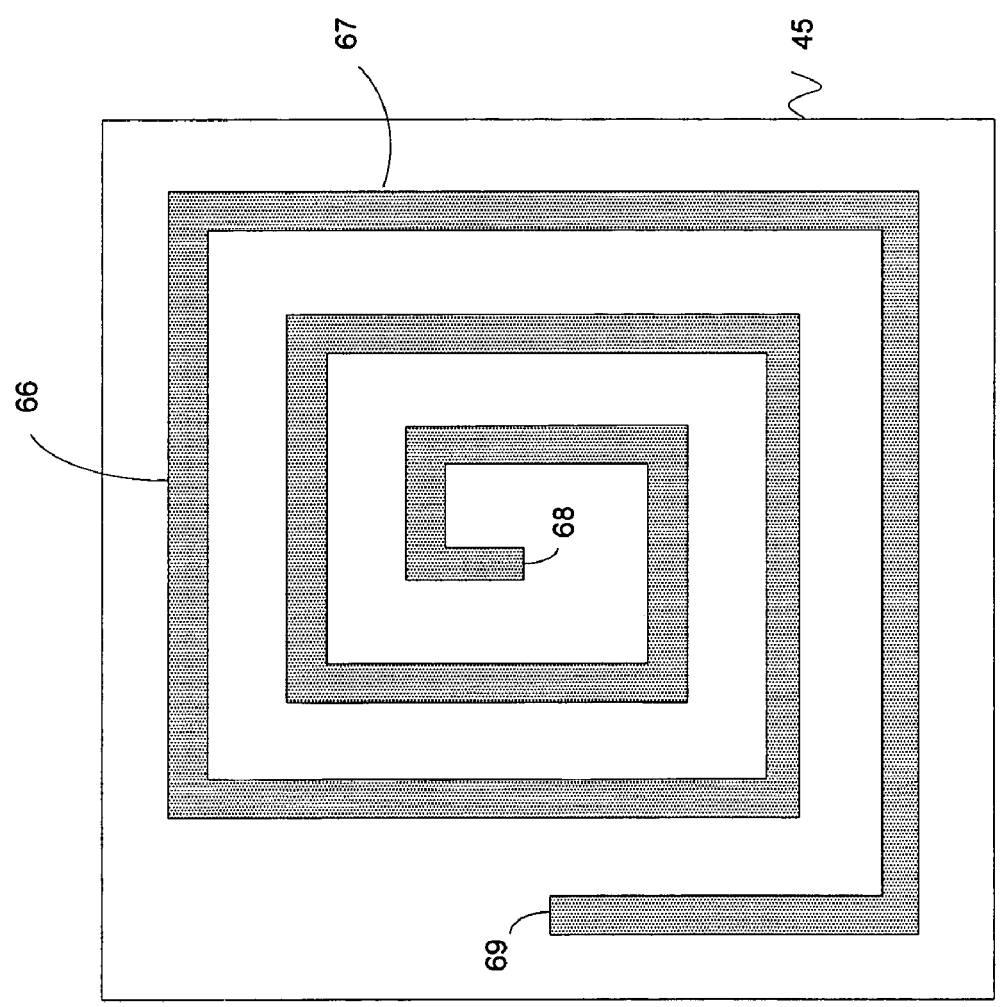
FIG. 9 is a view of another embodiment of an inductor for a signal connector of the LGA package of FIG. 7.
Figure 10:
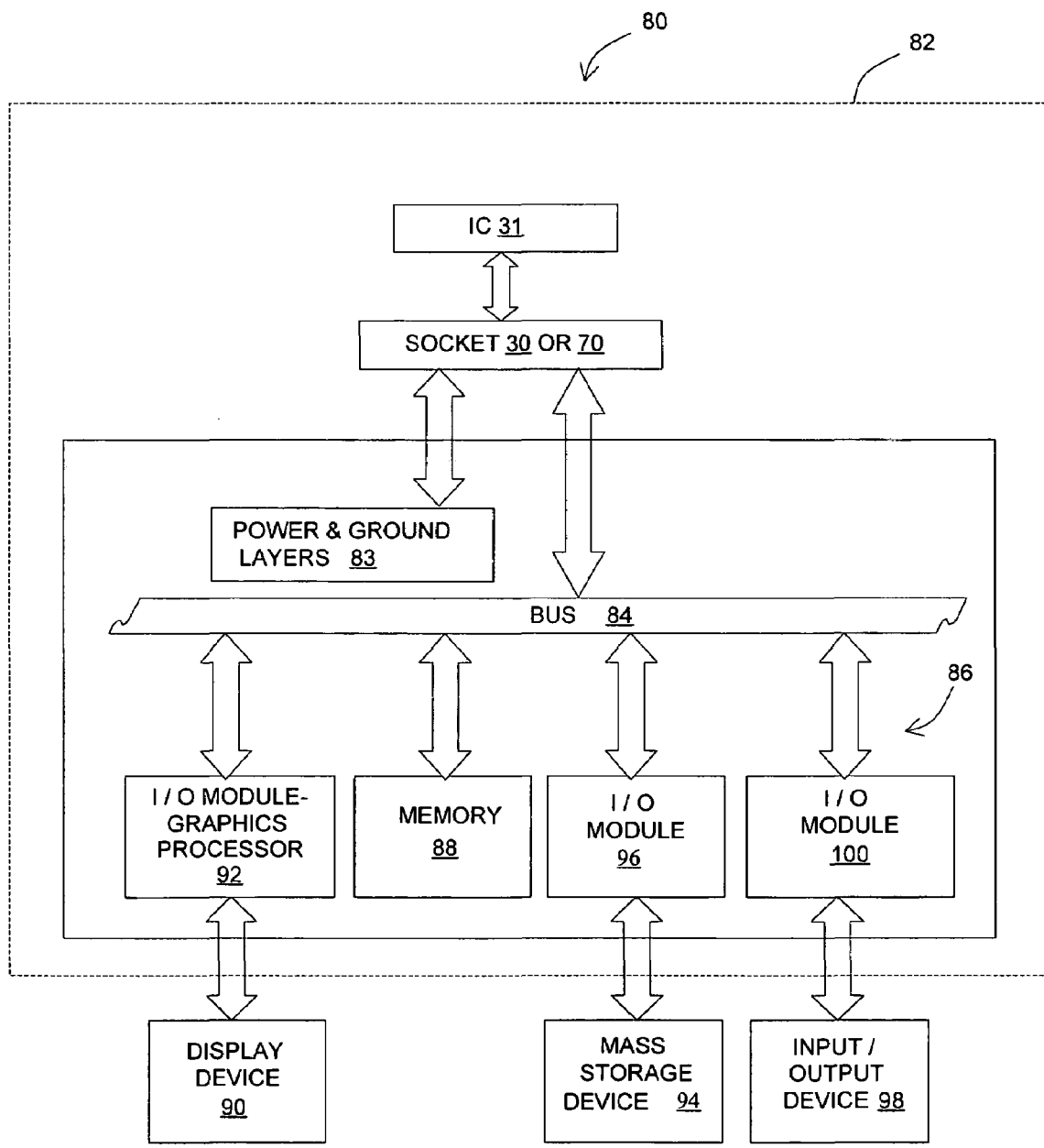
FIG. 10 is a block diagram of a system incorporating the LGA packages according to the various embodiments of the present invention.

Referring to FIGS. 7–9, an LGA package 60, according to another embodiment of the invention, is illustrated. Since the LGA package 60 is the same as the LGA package 30, except for the inclusion of a series inductor 62 into each of a plurality of signal connector 64, the other elements of the LGA package 60 will retain the same reference numerals as used in FIGS. 2–6. Moreover, these elements will not be described again, except as needed to describe the introduction of the inductor 62 into the signal connectors 64. Also, the signal connectors 64 are the same as the signal connectors 46 of FIGS. 3 and 4, except that the metal signal trace 50A of FIGS. 3 and 4 is modified in FIG. 7 to include the inductor 62.

With reference to FIGS. 7 and 8, in one embodiment, the inductor 62 may comprise a single loop series inductor in the form of a metal trace 65 formed in the dielectric material 45 (see FIG. 7, not shown in FIG. 8) that fills the hole 52 in the ground plane 41A of FIG. 7. One end of the metal trace 65 may be coupled to the via 48B and the other end may be coupled to the via 48A (via 48A truncated in FIG. 8). With reference to FIGS. 7 and 9, increased inductance may be introduced by providing more coils to the series inductor. FIG. 9 illustrates a multi-coil inductor 66 to be used in place of the inductor 62 in FIG. 8. The inductor 66 may include a spiral trace 67 with a first end 68 coupled to the signal via 48A and a second end 69 coupled to the signal via 48B. In another embodiment, the inductor 62 or 66 may be implanted in the signal routing layer 44A (see FIG. 2). Hence, placement of the inductor 62 or 66 may be embedded in different locations other than in the dielectric material 45 filling the holes 52 in the metal ground layer 41A.

Referring back to FIGS. 2 and 3, since flip-flop mounting is used in this illustrative embodiment, the vias 48 of each signal connector 46 may be progressively moved inward toward the center of the substrate 32 by way of the metal signal traces 50 so as to transform the more widely distributed land pads 36 to the more narrowly distributed die pads 40. The die pads 40 may be coupled to bonding pads (not shown) of the chip 31 by way of solder bumps 61. However, in embodiments where other die-to-substrate interconnect techniques are used, it may be unnecessary to have this inwardly staggered relationship of the signal vias 48. The LGA package 30 (or the LGA package 60 of FIG. 7) may use a number of other interconnect techniques, such as wire bonding or TAB.

With reference to FIGS. 2 and 3, the electrical paths through the substrate 32 for ground and power voltages Vss and Vcc may be provided by vias electrically interconnecting the power and ground pads to their respective metal layers and by vias electrically interconnecting multiple layers. For example, four ground electrical paths 70 are shown for the ground voltage Vss in the segment of the substrate 32 shown in FIG. 2. Each of the ground electrical paths 70, in addition to the ground layers 41A, 41B and 41C, may include interconnecting vias 72A, 72B, 72C, 72D, 72E and 72F. The ground electrical paths 70 are electrically coupled to each other by the ground layers 41A–41C so as to form the Vss ground plane. In one embodiment, each pair of signal land pads 36A may be surrounded with ground land pads 36B. For example, each pair of differential signal land pads 36A may surrounded by 10 ground land pads 36B forming a rectangle of 4 pads 36B by 3 pads 36B.

Similar via structures to those used for the ground voltage Vss may be used for passing the power voltage Vcc to and from the power plane 43, but the segment of the substrate 32 selected for illustration does not include the power connectors extending from the power land pads on the first surface 34 to the power plane 43 and then to the power die pads on the second surface 38. The land pads 36 may be connected to the external PCB (not shown) by a plurality of solder balls (not shown) or may be coupled to the PCB by way of a socket. In the latter embodiment, the land pads 36 may engage a plurality of spring biased contacts of the socket, with the socket being soldered to the PCB. The various signal traces 50C, 50D and 50F may be electrically isolated from the ground and power planes by surrounding gaps 74A, 74 B and 74C, which may be filed with a dielectric material. For example, the ground layer 41A may be in the same layer of the LGA package as the signal trace 50C, because the two metal conductors are separated by dielectric material 45 in the gap 74A. Although the package 30 is shown with 8 layers, there may be more or less layers than shown.

In summary, to improve the signal integrity, the LGA package 30 introduces holes 52 on the ground layer 41A of the Vss plane adjacent to the signal land pads 36A Due to the creation of holes 52, the capacitance between signal land pads 36A and VSS plane may be reduced. In LGA package 60, an added integrated inductor may further compensate for this capacitance, improving the package electrical performance in higher frequency band.

Referring to FIG. 11, there is illustrated a system 80, which is one of many possible systems in which the LGA package 30 or 60 may be used. In this illustrative system 80, the chip 31, which is mounted in the LGA package 30 or 60, may be a processor. The LGA package 30 or 60 may be directly coupled to a PCB 82 or indirectly coupled by way of a socket (not shown). The PCB 82 may be a motherboard. In this embodiment, the power/ground land pads of the LGA package 30 or 60 may be coupled to the power and ground planes 83 in the PCB 82. The I/O signal land pads of the LGA package 30 or 60 may be coupled to a bus 84. The bus 84 interconnects the LGA package 30 or 60 (and therefore the microprocessor) with one of more devices 86. The I/O signals on the bus 84 may include data, address, and control signals.

In this illustrative embodiment of the system 80, the devices 86 may include a main memory 88 and a plurality of input/output (I/O) modules for external devices or external buses, all coupled to each other by the bus 84. More specifically, the system 80 may include a display device 90 coupled to the bus 84 by way of an I/O module 92, with the I/O module 92 having a graphical processor and a memory. The system 80 may further include a mass storage device 94 coupled to the bus 84 via an I/O module 96. Another I/O device 98 may be coupled to the bus 84 via the I/O module 100. Additional I/O modules may be included for other external or peripheral devices or external buses. Examples of the memory 88 include, but are not limited to, static random access memory (SRAM) and dynamic random access memory (DRAM). The memory 88 may include an additional cache memory. Examples of the mass storage device 94 include, but are not limited to, a hard disk drive, a compact disk drive (CD), a digital versatile disk driver (DVD), a floppy diskette, a tape system and so forth. Examples of the input/output devices 98 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 82. The bus 84 may include a single bus or as a combination of buses (e.g., system bus with expansion buses). Examples of the bus system 84 include, but are not limited to, a Peripheral Component Interconnect-X (PCI-X) bus, peripheral control interface (PCI) bus, and Industry Standard Architecture (ISA) bus, and so forth. Depending upon the external device, I/O modules internal interfaces may use programmed I/O, interrupt-driven I/O, or direct memory access (DMA) techniques for communications over the bus 84. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire).

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit package, comprising:
    a substrate including a first surface having a plurality of signal land pads and a second surface having a plurality of signal die pads;
    a plurality of signal connectors arranged to electrically couple the plurality of the signal land pads to the plurality of the signal die pads;
    a ground plane, disposed in an adjacent, spaced-apart relationship to the plurality of signal land pads;
    the ground plane including a plurality of holes with at least one of the holes having at least one of the signal connectors extending therethrough and being dimensioned and configured approximately to be as large or larger than at least one of the signal land pads, with the at least one signal land pad being disposed adjacent to the at least one hole and connected to the at least one signal connector; and the at least one signal connector including a serial inductor substantially disposed in the at least one hole and including at least one loop.

2. The integrated circuit package according to claim 1, wherein the at least one hole is dimensioned and configured to form a gap between the ground plane and the serial inductor of the at least one signal connector and the gap is filed with a dielectric material.

3. The integrated circuit package according to claim 1, further comprising:
a signal routing layer, the ground plane being disposed between the signal routing layer and the signal land pads.

4. The integrated circuit package according to claim 1, wherein the plurality of signal connectors includes a plurality of pairs of differential signal connectors coupled to a plurality of pairs of the signal land pads, with the differential signal connectors of at least one of the pairs of differential signal connectors being disposed adjacent to each other and the signal land pads of at least one of the pairs of signal land pads coupled to the at least one pair of differential signal connectors beings disposed adjacent to each other.

5. The integrated circuit package according to claim 4, wherein the at least one signal connector extending through the at least one hole includes one of the pairs of differential signal connectors.

6. The integrated circuit package according to claim 5, wherein at least one of the holes is dimensioned and configured approximately to be as large or larger than one of the pairs of signal land pads.

7. The integrated circuit package according to claim 6, wherein at least one of the holes is substantially centered on a center axis of one of the pairs of signal land pads.

8. The integrated circuit package according to claim 1, further comprising:
an insulating material disposed between the ground plane and the plurality of signal land pads, with the insulating material having the plurality of signal connectors extending therethrough.

9. The integrated circuit package according to claim 1, wherein the at least one signal connector further includes a first via extending from the at least one signal land pad; the serial inductor being a coiled signal trace; the coiled signal trace coupled to the first via and disposed in a layer also including the ground plane; and a second via extending from the coiled signal trace and coupled to one of the signal die pads.

10. The integrated circuit package according to claim 1, wherein the at least one hole is approximately centered on a center axis of the at least one signal land pad.

11. The integrated circuit package according to claim 1, wherein the at least one loop includes a plurality of loops.

12. A system, comprising:
a printed circuit board having a bus;
a package including an integrated circuit chip; a substrate including a first surface having a plurality of signal land pads coupled to the bus and a second surface having a plurality of signal die pads coupled to the integrated circuit chip; a plurality of signal connectors arranged to electrically couple the plurality of the signal land pads to the plurality of the signal die pads; a ground plane, disposed in an adjacent, spaced-apart relationship to the plurality of signal land pads; and the ground plane including a plurality of holes with at least one of the holes having at least one of the signal connectors extending therethrough and being dimensioned and configured approximately to be as large or larger than at least one of the signal land pads, with the at least one signal land pad being disposed adjacent to the at least one hole and connected to the at least one signal connector;
a mass storage device coupled to the bus; and
the at least one signal connector including a serial inductor substantially disposed in the at least one-hole and including at least one loop.

13. The system according to claim 12, further comprising an input/output network interface module coupled to the bus and a main memory coupled to the bus.

14. The system according to claim 12, wherein the system is selected from a group consisting of a set-top box, an entertainment unit and a DVD player.

15. The system according to claim 12, wherein the at least one hole is substantially centered on a center axis of the at least one signal land pad.

16. The system according to claim 12, wherein the serial inductor is a coiled signal trace; and the integrated circuit package further includes a dielectric material filling a portion of the at least one hole not filled by the coiled signal trace.

17. The system according to claim 13, wherein the at least one signal connector further includes a first via disposed on one side of the at least one hole and a second via disposed on another side of the at least one hole; and the coiled signal trace having one end coupled to the first via and another end coupled to the second via.

18. The system according to claim 12, wherein the at least one loop includes a plurality of loops.

19. An integrated circuit package, comprising:
a substrate including a first surface having a plurality of signal land pads and a second surface having a plurality of signal die pads;
a plurality of signal connectors arranged to electrically couple the plurality of the signal land pads to the plurality of the signal die pads;
at least one of the plurality of signal connectors includes a serial inductor including at least one loop;
a ground plane, disposed in an adjacent, spaced-apart relationship to the plurality of signal land pads; and
the ground plane including a plurality of holes with at least one of the holes having at least one of the signal connectors extending therethrough and being dimensioned and configured approximately to be as large or larger than at least one of the signal land pads, with the at least one signal pad being disposed adjacent to the at least one hole and connected to the at least one signal connector; and the serial inductor being substantially disposed in the at least one hole.

20. The integrated circuit package according to claim 19, wherein the at least one signal connector further includes a first via extending from the at least one signal land pad; the serial inductor being a coiled signal trace; the coiled signal trace coupled to the first via and disposed in a layer also including the ground plane; and a second via extending from the coiled signal trace and coupled to one of the signal die pads.

21. The integrated circuit package according to claim 20, wherein at least one of the plurality of holes is filled with a dielectric material and the coiled signal trace is embedded in the dielectric material.

22. The integrated circuit package according to claim 19, wherein the at least one hole is approximately centered on a center axis of the at least one signal land pad.

23. The integrated circuit package according to claim 19, wherein the at least one loop includes a plurality of loops.

* * * * *

UNITED STATES PATENT AND TRADEMARK OFFICE
CERTIFICATE OF CORRECTION

PATENT NO. : 7,227,247 B2  Page 1 of 1
APPLICATION NO. : 11/060104
DATED : June 5, 2007
INVENTOR(S) : Xiang Yin Zeng et al.

It is certified that error appears in the above-identified patent and that said Letters Patent is hereby corrected as shown below:

Column 7
Lines 7-8, "...gap is filed..." should read --...gap is filled...--.

Line 21, "...beings disposed..." should read --...being disposed...--.

Column 8
Line 6, "...one-hole..." should read --...one hole...--.

Signed and Sealed this

Sixteenth Day of September, 2008

JON W. DUDAS
*Director of the United States Patent and Trademark Office*